United States Patent
Seitz et al.

(10) Patent No.: US 6,716,734 B2
(45) Date of Patent: Apr. 6, 2004

(54) LOW TEMPERATURE SIDEWALL OXIDATION OF W/WN/POLY-GATESTACK

(75) Inventors: Mihel Seitz, Wappingers Falls, NY (US); Ravikumar Ramachandran, Pleasantville, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/965,092

(22) Filed: Sep. 28, 2001

(65) Prior Publication Data

US 2003/0064576 A1 Apr. 3, 2003

(51) Int. Cl.[7] .................. H01L 21/3205; H01L 21/4763
(52) U.S. Cl. .................. 438/592; 438/591; 438/595
(58) Field of Search .................. 438/216, 592, 438/591, 471, 163, 595, 635

(56) References Cited

U.S. PATENT DOCUMENTS

| | | | |
|---|---|---|---|
| 4,503,601 A | 3/1985 | Chiao | |
| 5,248,350 A | 9/1993 | Lee | |
| 5,412,246 A | 5/1995 | Dobuzinsky et al. | |
| 5,576,579 A * | 11/1996 | Agnello et al. | 257/22 |
| 5,616,947 A * | 4/1997 | Tamura | 257/289 |
| 5,856,853 A * | 1/1999 | Konuma et al. | 349/110 |
| 5,874,758 A | 2/1999 | DeBrosse | |
| 5,982,609 A | 11/1999 | Evans | |
| 6,090,671 A | 7/2000 | Chan et al. | |
| 6,096,590 A | 8/2000 | Chan et al. | |
| 6,100,188 A | 8/2000 | Lu et al. | |
| 6,111,557 A * | 8/2000 | Koyama et al. | 345/100 |
| 6,187,656 B1 | 2/2001 | Lu et al. | |
| 6,204,112 B1 | 3/2001 | Chakravarti et al. | |
| 6,245,605 B1 * | 6/2001 | Hwang et al. | 438/216 |
| 6,258,659 B1 | 7/2001 | Gruening et al. | |
| 6,281,064 B1 | 8/2001 | Mandelman et al. | |
| 6,281,552 B1 * | 8/2001 | Kawasaki et al. | 257/344 |
| 6,362,507 B1 * | 3/2002 | Ogawa et al. | 257/350 |

FOREIGN PATENT DOCUMENTS

| EP | 0 805 488 A2 | 4/1997 |
|---|---|---|
| EP | 0 849 777 A2 | 6/1998 |

OTHER PUBLICATIONS

Hook, T. B., et al., "Nitrided Gate Oxides for 3.3–V Logic Application: Reliability and Device Design Considerations," IBM J. Res. Develop, vol. 43, No. 3, May 1999.

* cited by examiner

Primary Examiner—John F. Niebling
Assistant Examiner—Walter L. Lindsay, Jr.

(57) ABSTRACT

In a method of making a W/WN/Poly-Gatestack, the improvement of providing low temperature sidewall oxidation to affect less outdiffusion of dopant implants near the surface to allow more margin in small groundrule device design for a support device, comprising:

depositing a silicon layer on a substrate; forming a W-containing nitride layer on the deposited silicon;

depositing a W layer on the W-containing nitride layer to form a W/WN/silicon stack; and performing a gatesidewall anodic oxidation by affecting a mask open to enable contacting W at its wafer edge and putting the gatestack on the positive potential or anode and the counter electrode on the negative potential.

5 Claims, 3 Drawing Sheets

LOW TEMPERATURE SIDEWALL OXIDATION OF W/WN/POLY-GATESTACK

BACKGROUND OF THE INVENTION

1. Field of the Invention

The invention relates to a process flow to obtain low temperature sidewall oxidation for W/WN/Poly-gatestack semiconductor structures. The process utilizes temperatures far below the currently used 1050° C. temperature via anodic oxidation, thereby providing less outdiffusion of implants near the surface, and allows more margin in small groundrule device design for support devices, such as buried p-FET.

2. Description of Related Art

A conventional polycide gate stack in a DRAM device may include a gate electrode stack, which is referred to by the acronym GC. This GC may consists of the following composite sequence of layers:

Silicon/gate oxide/N+ doped polysilicon/$WSi_x$/cap-insulator, where the patterned N+ doped polysilicon and $WSi_x$ layers comprise the gate conductor (GC) in the gate electrode stack.

The fabrication of the polycide structure generally consist of an in-situ doped polysilicon deposition, or polysilicon deposition followed by implantation of As+ or P+, followed by a cleaning and tungsten ($WSi_x$) deposition. However, one problem encountered during fabrication employing a post GC stack heat cycle step is that dopant atoms in the polysilicon migrate into the $WSi_x$ layer. When the dopant is distributed and accumulates at the polysilicon/$WSi_x$ and $WSi_x$/cap silicon nitride interfaces, this migration and pile-up of dopant reduces the dopant concentration at the polysilicon/gate oxide interface and causes a partially depleted gate that degrades the FET performance by increasing the equivalent oxide thickness.

U.S. Pat. No. 5,923,999 discloses a process of preventing migration of dopant atoms from a polysilicon layer into the $WSi_x$ layer in post gate conductor (GC) heat cycles. The method forms a stable dopant diffusion barrier in a polysilicon/$WSi_x$ structure to minimize outdiffusion of dopant from the polysilicon layer into the $WSi_x$ layer. The diffusion barrier prevents depletion of dopants in polysilicon during post-$WSi_x$ deposition annealing, and insures that a high concentration of electrically active dopant material remains at the polysilicon/gate oxide interface to avoid an increase in the equivalent oxide thickness and the associated degradation in the MOSFET performance.

A process for manufacturing DRAMs using stacked container capacitor cells in a split-polysilicon CMOS manufacturing flow is disclosed in U.S. Pat. No. 5,716,862. The semiconductor manufacturing process for forming insulated transistor gates Is accomplished by performing a temperature controlled insulation step wherein the temperature range is between 600–957° C. to form polygate sidewall oxidation about the vertical sidewalls of the p-channel transistor gate electrodes, followed by performing a ptype impurity implant into the n-well regions.

There is a need for a low temperature sidewall oxidation for a W/WN/poly-gate stack to prevent out diffusion of dopant implants near the surface and to allow more margin in device design for support devices, such as buried p-FET, when preparing semiconductors.

SUMMARY OF THE INVENTION

One object of the present invention is to provide a process flow in semiconductor processing of a W/WN/poly gate stack to provide low temperature sidewall oxidation for the gate stack to obtain less outdiffusion of implants near the surface and to thereby allow more margin in small groundrule device design for support devices, such as buried p-FET.

A further object of the present invention is to provide, in a process flow for preparing semiconductor devices comprising a W/WN/poly gate stack to utilize a sidewall oxidation temperature less than about 1050° C. in view of the need for temperature constraints that are more stringent at present because of the lack of margin in small groundrule device design existing at present.

A yet further object of the present invention is to provide, in a process flow for preparing a semiconductor comprising a W/WN/poly-gate stack, to allow a low temperature sidewall oxidation of the gatestack to obtain less outdiffusion of dopant implants near the surface by utilizing low temperatures for sidewall oxidation employing anodic oxidation.

In general, the process flow for preparing the low temperature gate sidewall oxidation GC stack (W/WN/poly & cap SiN) semiconductor device is prepared by:

1. Utilizing total GC lithography, where the GC total is a combination of: PORGC lithography and connecting all of the GC features, with no etch bead removal;
2. Employing a conventional POR etch;
3. Connecting all GC features with large structures;
4. Covering the wafer with photoresist;
5. Performing etch bead removal;
6. Affecting a mask opening to enable contacting W at the wafer edge(3 mm) with an anode;
7. Performing anodic oxidation—putting the gate stack on positive and the counter electrode on negative potential (weak acid)—the anode is formed via metal ring press contact—and ensuring that the anode is not in contact with the acid (no HF containing material)—all connected W/WN/Poly stack has sidewall oxide—the chosen acid determining the ratio. between oxide thickness on the poly and W;
8. Opening up the GCs in the array and supports;
9. Using a second GC mask to separate the GC lines;
10. Utilizing a best case MUV
11. Utilizing a worst case second DUV; and
12. Employing a second GC etch that also removes sidewall oxide.

DETAILED DESCRIPTION OF THE PREFERRED EMBODIMENT OF THE INVENTION

Conventional processes of preparing W/WN/poly stack gate electrodes are based on a physical vapor deposition (PVD) process. In these processes, WN films are deposited on poly by reactive sputtering a W target in a gas mixture consisting of $Ar:N_2=1:1$. W films are then deposited using a DC magnetron. However, the application of the above process to MOS devices with severe topography is limited due to poor step coverage of PVD films. Further, excess nitrogen in the $WN_x$ layer poses a problem of delamination since the gas may escape from the stack during subsequent thermal treatment. Typically, the process for depositing a diffusion barrier has a relatively low effective throughput that is less than 20 wafers per hour.

Accordingly, there remains a need in the art for low-resistance W-poly gate structures and an effective and efficient process for forming the W-poly gate structures characterized by low temperature sidewall oxidation of the W/WN/Poly-Gate stack to affect less outdiffusion of dopant implants near the surface to allow more margin in small groundrule device design for support devices.

The process flow for preparing the low temperature sidewall oxidation of the W/WN/Poly-gate stack of the invention using anodic oxidation. is accomplished by:

1. Utilizing total GC lithography, where the GC total is a combination of: PORGC lithography and connecting all of the GC features, with no etch bead removal;
2. Employing a conventional POR etch;
3. Connecting all GC features with large structures;
4. Covering the wafer with photoresist;
5. Performing etch bead removal;
6. Affecting a mask opening to enable contacting W at the wafer edge(3 mm) with an anode;
7. Performing anodic oxidation—putting the gate stack on positive and the counter electrode on negative potential (weak acid)—the anode is formed via metal ring press contact—and ensuring that the anode is not in contact with the acid (no HF containing material)—all connected W/WN/Poly stack has sidewall oxide—the chosen acid determining the ratio between oxide thickness on the poly and W;
8. Opening up the GCs in the array and supports;
9. Using a second GC mask to separate the GC lines;
10. Utilizing a best case MUV
11. Utilizing a worst case second DUV; and
12. Employing a second GC etch that also removes sidewall oxide.

Figure 1:
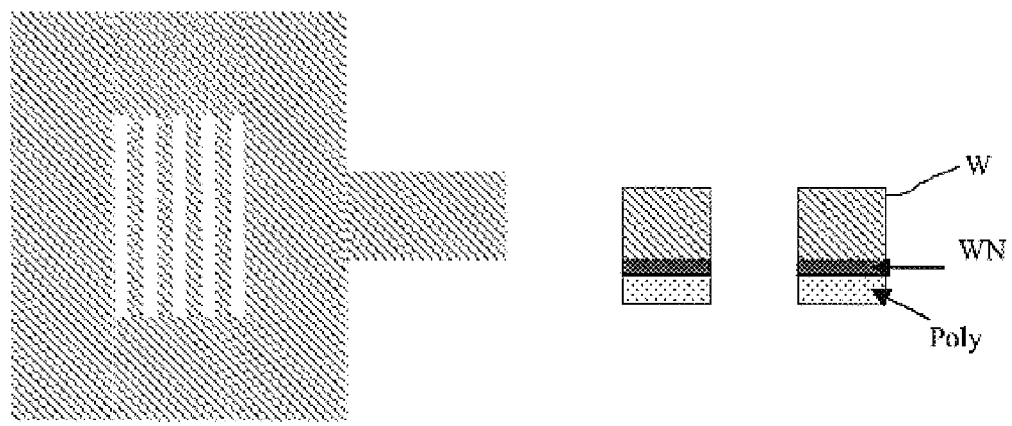
FIG. 1 shows a schematic of the W/WN/Poly-gate stack, which is formed from conventional patterning.

Reference is now made to FIG. 1 which shows a schematic of The W/WN/Poly-gate stack formed from conventional patterning (DUV).

Figure 2:
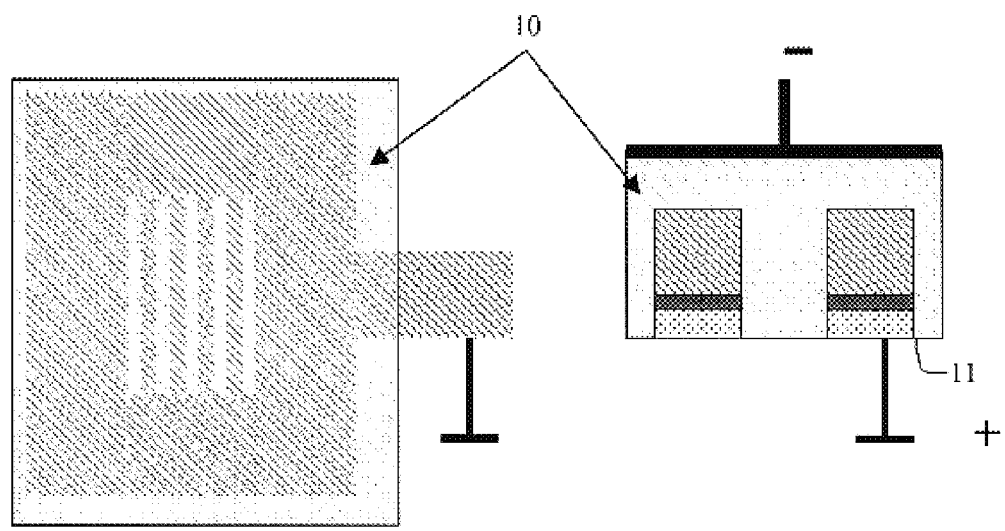
FIG. 2 shows a schematic of the invention, which affects anodic sidewall oxidation on the W/WN/Poly stack.

FIG. 2 shows a schematic of the invention process, commencing with the steps 6 and 7 wherein anodic oxidation is accomplished by putting the gate stack on the positive potential and the counter electrode on the negative potential in which there is no weak acid 10.

The anode may be formed with a metal ring press contact, thereby ensuring that the anode is not in contact with the weak acid. The connected W/WN/Poly stack is characterized by a sidewall oxide, and the weak acid chosen determines the ratio between the oxide thickness on the poly and the W.

In FIG. 2, all of the connected W/WN/Poly stack has side wall oxidation 11, and there is a later need to open up the GCs in the array and supports.

Figure 3:
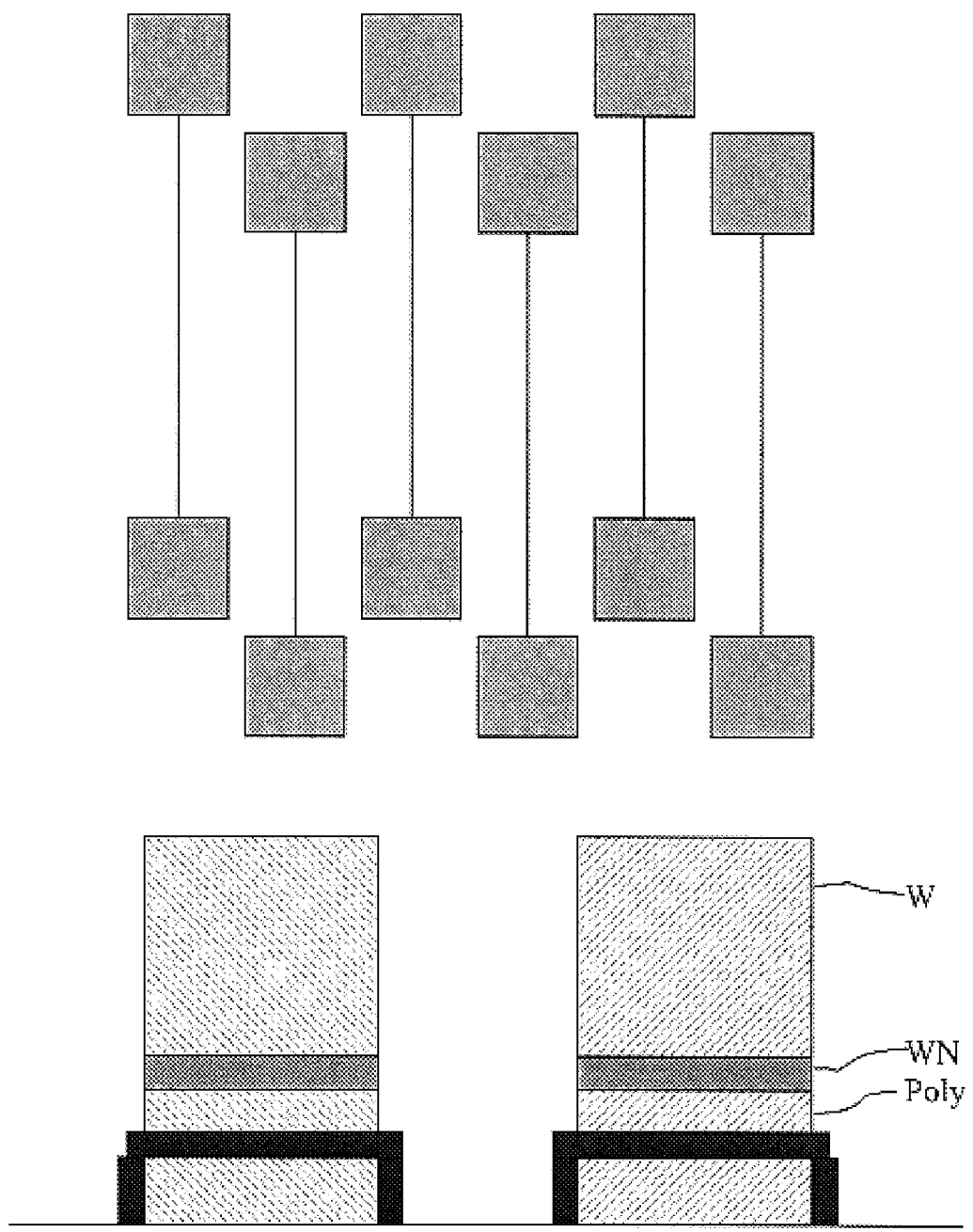
FIG. 3 shows a schematic of the invention process in which the second GC etch has removed the sidewall oxidation, but in which less stringent CD and profile control are required.

From FIG. 3, it may be seen that a second GC mask is utilized for separating GC lines, and the best case only MUV is not employed followed by the worst case second DUV. The second GC etch removes the sidewall oxide as well; however, there is less stringent CD and profile control now needed. The oxide on the poly sidewall thickness is a function of the potential across the anode.

After the W/WN/Poly-gate structure prepared as above is produced, known processing can be performed to pattern and etch the W/WN/Poly stack structure into the desired pattern for layer processing towards the end goal of manufacturing a complete semiconductor device.

The W/WN/Poly stack manufacturing process described therein is useful for manufacturing a wide range of microelectronic devices that require metal-poly gates. An example of such application is the fabrication of low-resistance wordlines for DRAM devices and gates for CMOS logic devices.

What is claimed is:

1. In a method of making a W/WN/Poly-Gatestack, the improvement of providing low temperature sidewall oxidation to affect less outdiffusion of dopant implants near the surface to allow more margin in small groundrule device design for a support device, comprising:

depositing a silicon layer on a substrate;

forming a W-containing nitride layer on the deposited silicon;

depositing a W layer on the W-containing nitride layer to form a W/WN/silicon stack; and performing a mask opening to enable contacting W at its wafer edge with an anode, and performing anodic oxidation by putting the gatestack on the positive potential or anode and the counter electrode on the negative potential; said anode being formed by a metal ring press contact.

2. The method of claim 1 wherein said negative potential is a weak acid.

3. The method of claim 2 wherein said acid is a weak acid that excludes HF.

4. The method of claim 3 wherein said low temperature sidewall oxidation is accomplished at a temperature below about 1050° C.

5. The method of claim 4 wherein said support device is a buried p-FET.

* * * * *